United States Patent [19]
McElroy et al.

[11] 3,986,178
[45] Oct. 12, 1976

[54] INTEGRATED INJECTION LOGIC RANDOM ACCESS MEMORY

[75] Inventors: David J. McElroy; Wiley P. Snuggs, both of Houston, Tex.

[73] Assignee: Texas Instruments, Dallas, Tex.

[22] Filed: July 28, 1975

[21] Appl. No.: 599,578

[52] U.S. Cl. ............................. 340/173 R; 307/238
[51] Int. Cl.² ........................................ G11C 11/40
[58] Field of Search ................. 340/173 R, 173 PE; 307/238

[56] References Cited
UNITED STATES PATENTS 3,218,613  11/1965  Gribble ........................... 340/173 R

*Primary Examiner*—Terrell W. Fears
*Attorney, Agent, or Firm*—Harold Levine; John G. Graham

[57] ABSTRACT

An integrated injection logic memory cell includes a latch circuit for holding a binary bit of information. Circuits are provided to maintain current injection into the latch circuit at all times, including during the reading and writing operations. The latch circuit is made up of a pair of cross coupled vertical, inverted transistors. The circuits for maintaining the injection current into the latch are made up of lateral transistors selectivity coupled to a memory access control circuit for supplying bi-level signals through word and column select lines.

19 Claims, 8 Drawing Figures

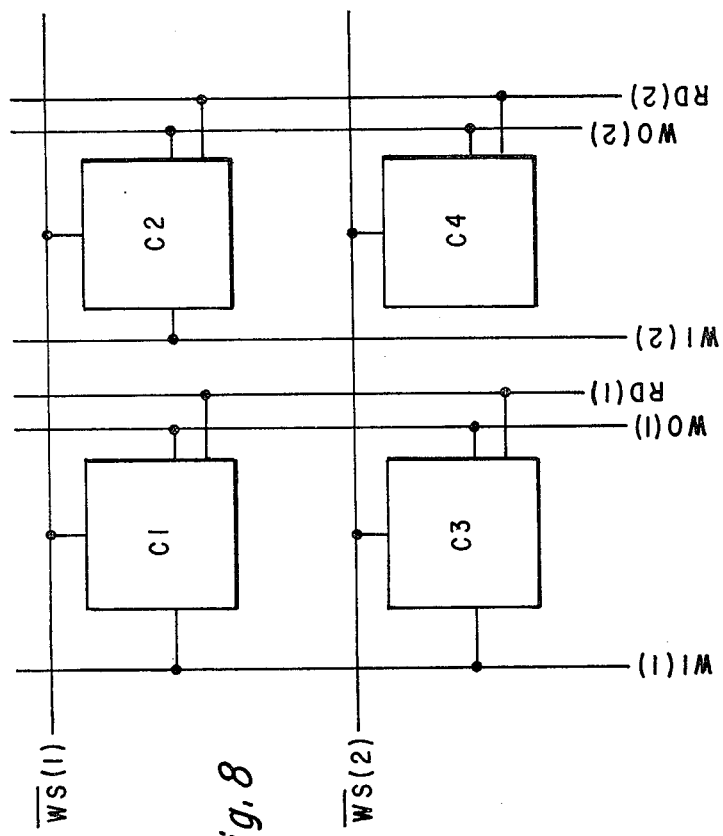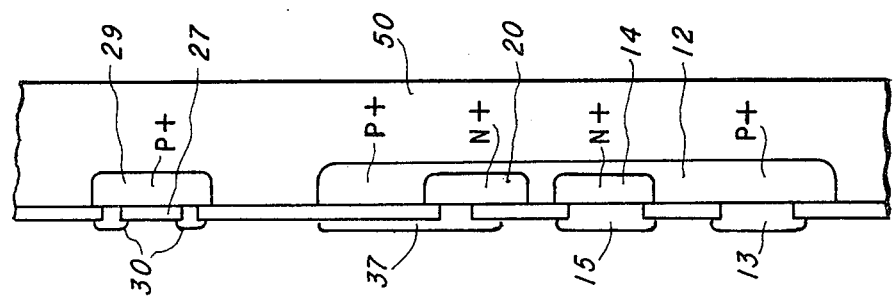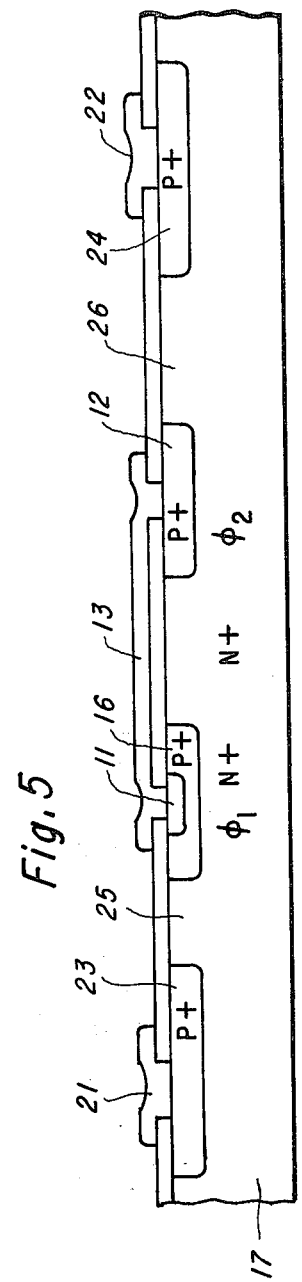

INTEGRATED INJECTION LOGIC RANDOM ACCESS MEMORY

BACKGROUND OF THE INVENTION

1. Field of the Invention

This invention pertains to semiconductor memories and particularly to non-isolated integrated injection logic ($I^2L$) memory cells.

2. Description of the Prior Art

Currently, several "logic circuit families" are known, and may be divided into those in unipolar (FET) and those in bipolar technology. Particularly well known are RTL (resistor-transistor logic), DTL (diode-transistor logic), TTL (transistor-transistor logic) and ECL (emitter-coupled logic) circuit families. The latest addition to the unipolar family is the $I^2L$ (integrated injection logic).

These various circuit families have been used in logic arrays to make up digital systems, particularly digital computers which require memories. The memories have been made up of ferrite cores and semiconductor devices. An effort has also been made to employ $I^2L$ circuits.

A chief difficulty in employing $I^2L$ circuitry in memory applications is that $I^2L$ circuitry is basically of a static nature and depends on current switching. Dynamic storage and transfer devices normally applied in dense memories are not available in $I^2L$. As a result, prior art $I^2L$ memory elements have been gated latches resulting in relatively large memory cell areas. A more recent approach utilizing $I^2L$ techniques is to at least partially isolate the emitters of the vertical, inverted transistors for the purpose of addressing the cell through the emitter circuit. In this technique, power must be removed from the latch when reading out. Therefore, the information within the cell is retained by its inherent capacity and sophisticated sensing circuitry is required because of the transitory nature of the read-out signal.

The instant invention utilizes $I^2L$ circuitry in a memory, but does not require separate emitter diffusions for word select and is not dependent upon the capacitive characteristics of the circuitry for read-out, but rather continues to inject current during a read-out cycle, as well as during the write cycle. Also, the process of manufacturing a non-isolated $I^2L$ memory is simpler than the process of manufacture required to provide separate emitter diffusions for word select.

BRIEF SUMMARY OF THE INVENTION

A pair of vertical, inverted transistors with their emitters formed in a common emitter region are cross connected in a latch configuration wherein when one of the transistors is conducting, the other is shut off and vice versa. When one of the transistors is conducting, the latch is arbitrarily designated as being in the binary 1 state, and when the other transistor is conducting the latch is designated as being in the 0 state. The emitter region of the vertical transistors has formed therein a word select line of the opposite conductivity from that of the emitter region. The word select line is connected to a memory access control circuit and serves as the emitter for a lateral injection transistor whose collectors are integral with the bases of the vertical transistors and whose base is integral with the common emitter region. A pair of conductors serving as a "write 1" line and "write 0" line, respectively, are provided. Each is connected to a lateral transistor whose emitters are formed in the common emitter region of the opposite conductivity type and whose collectors are integral with the bases of the corresponding vertical transistors. They provide the current injection required during a writing operation to set the latch into the desired state and, in the preferred embodiment, to maintain current injection during the read mode.

An inverted vertical output transistor is employed whose base is connected to one collector of one of the vertical transistors making up the latch. Its collector is connected to a third conductor employed for reading the contents of the memory cell. Base drive is applied to the output transistor by way of one of the lateral transistors connected to a write line.

An object of this invention is to provide a memory matrix utilizing $I^2L$ circuitry which can be produced to have an extremely high packing density by means of a process of manufacture that is relatively simple.

Another object is to provide an $I^2L$ memory cell that has current injection available at all times, including during the memory access times.

These and other objects will be evident in the detailed description that follows.

BRIEF DESCRIPTION OF THE DRAWINGS

FIG. 5 is a sectional elevation taken along section 5—5 in FIG. 4.

FIG. 6 is a sectional elevation taken along 6—6 in FIG. 4.

FIG. 8 is a block diagram of a simplified array of memory cells.

DETAILED DESCRIPTION

Figure 1:
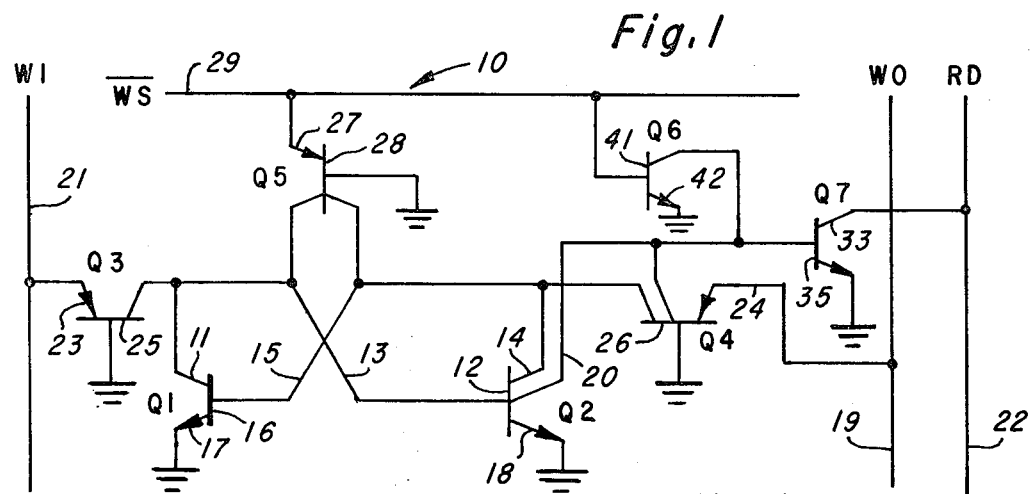
FIG. 1 is a schematic diagram of the preferred embodiment of a single memory cell.

FIG. 1 illustrates a single memory cell 10 utilizing a pair of vertical, inverted transistors Q1 and Q2 forming a latch circuit. The collector 11 of Q1 is connected through conductor 13 to the base 12 of Q2 and the collector 14 of transistor Q2 is connected through conductor 15 to the base 16 of transistor Q1. The transistors Q1 and Q2 share a common emitter region and are of the NPN type. A lateral PNP type transistor Q5 serves to inject current into the latch transistors Q1 and Q2. Transistor Q5 has its base formed in the common emitter region 50 and its collectors are the bases of transistors Q1 and Q2, respectively. The emitter of Q5 is formed by the word select ($\overline{WS}$) line 29 which is formed in the common emitter region 50 of a semiconductor material of the conductivity type opposite to that of the common emitter region. $\overline{WS}$ line 29 is connected to a memory access control circuit for providing to line 29 an arbitrarily selected binary 1 (+0.7 volts) or a binary 0 (0 volts). Such a control circuit is well known in the art. A typical control system utilizing TTL logic is shown in U.S. Pat. No. 3,436,738, issued Apr. 1, 1969, and assigned to the assignee of this invention.

Write 1 line 21 and write 0 line 19 are conductors which are attached to the control circuit and to which may be selectively applied a binary 1 or a binary 0.

Lateral PNP transistor Q3 has its emitter 23 formed in the common emitter region 50 of the opposite conductivity type and connected to W1 line 21. Lateral PNP transistor Q4 has its emitter 24 formed in the common emitter region 50, also of the opposite conductivity type and connected to W0 line 19. The bases 25 and 26, respectively, of transistors Q3 and Q4 are integral with the common emitter region 50. The base 12 of transistor Q2 serves as the collector of transistor Q3 and the base 16 of transistor Q1 serves as one collector of transistor Q4. A second collector of Q4 is the base 35 of output transistor Q7, which is a vertical NPN transistor whose collector 33 is connected to a conductor, read (RD) line 22. The second collector 37 of transistor Q2 is also connected to the base 35 of transistor Q7 as is the collector of vertical NPN transistor Q6. The base 41 of transistor Q6 is integral with $\overline{WS}$ line 29 and its emitter 42 is integral with the common emitter region 50.

Memory cell 10 may be one of a row of identical cells connected to a single $\overline{WS}$ line 29. The cell 10 may also be one of a plurality of identical cells connected to the W1, W0 and RD lines. Such an arrangement forms a well known memory matrix of cells.

Figure 2:
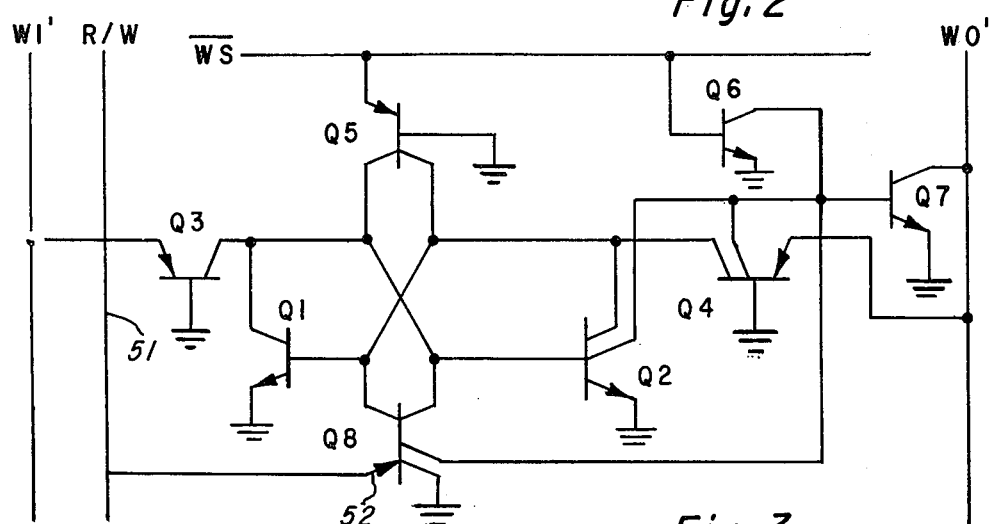
FIG. 2 is a schematic diagram of a variation from the schematic diagram of FIG. 1.

FIG. 2 is a schematic illustrating a variation from the cell of FIG. 1. The main difference is the addition of lateral PNP transistor Q8 and the use of a single line conductor W0'. Assoicated with transistor Q8 is R/W line 51 which is connected to the control circuit. Emitter 52 of transistor Q8 is formed of the opposite conductivity type within the common emitter region 50 and is connected to R/W line 51. Its base is the common emitter region 50. One collector is the base of transistor Q1 and a second collector is the base of transistor Q2, while a third collector is formed by the base of output transistor Q7. The W0' line is connected to the emitter of lateral transistor Q4' which differs from transistor Q4 in that it has but a single collector since it does not supply base drive to transistor Q7.

Figure 3:
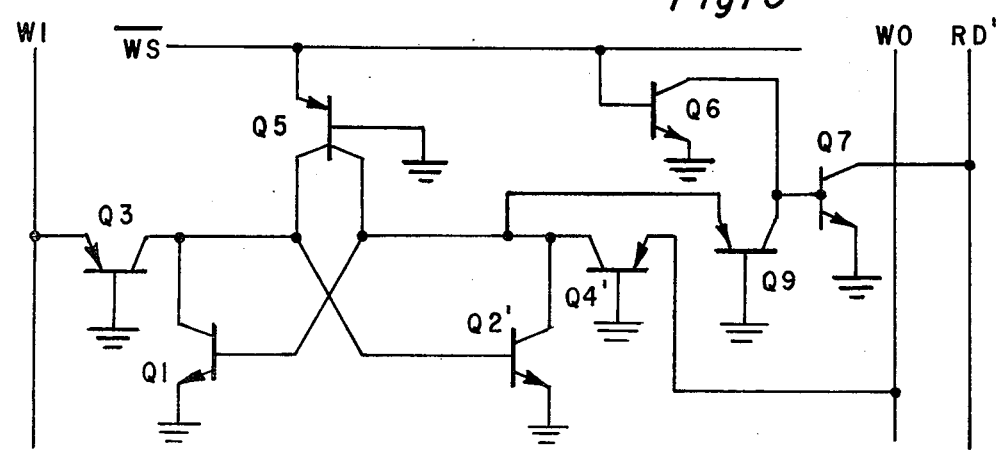
FIG. 3 is still another schematic diagram of a variation from the schematic diagram of FIG. 1.
Figure 4:
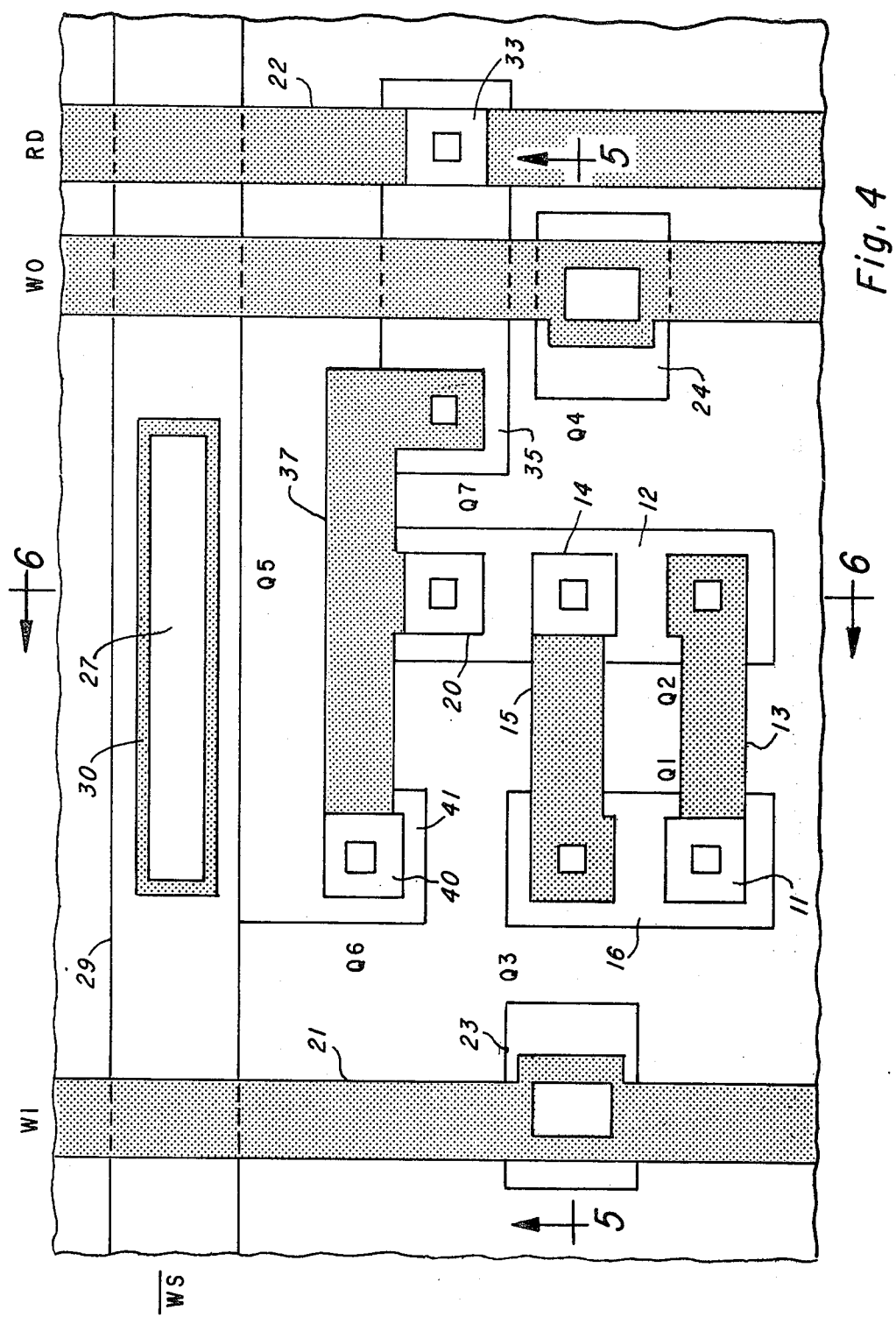
FIG. 4 is a plan view of the circuit of FIG. 1 as implemented in a semiconductor chip.

FIG. 3 is a schematic of still another variation from the circuit of FIG. 1 wherein the principal variation is the addition of lateral transistor Q9. The emitter of transistor Q9 is formed of the opposite conductivity semiconductor material in the common emitter region 50, its collector is the base 35 of transistor Q7 and its base is the common emitter region 50. Transistor Q9 supplies base drive to transistor Q7.

MODE OF OPERATION

Figure 7:
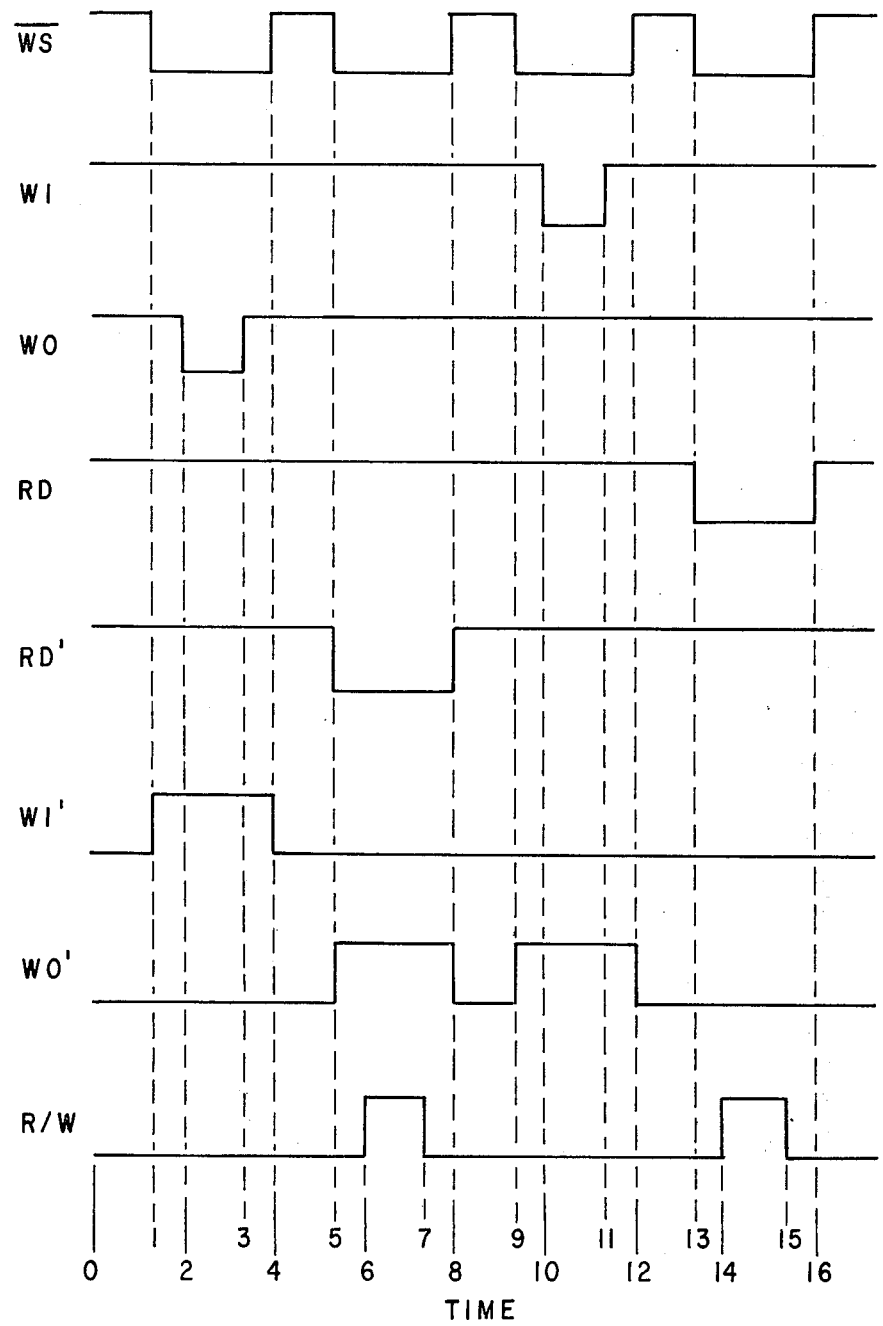
FIG. 7 illustrates binary signal inputs.

Referring now to FIGS. 1 and 7, the following discussion of the operation of the preferred embodiment of FIG. 1 can best be understood. The word select ($\overline{WS}$) line 29 is maintained at a positive voltage (approximately 0.7 volts) representing a binary 1, when memory cell 10 is simply holding a stored bit of information. In FIG. 7, this is represented by $\overline{WS}$ from time 0 to time 1. At time 1 $\overline{WS}$ is brought low (ground) representing a binary 0. When $\overline{WS}$ is a 1, lateral PNP transistor Q5 conducts, thereby injecting current into the latch circuit comprised of NPN transistors Q1 and Q2. When $\overline{WS}$ is 0, transistor Q5 is cut off and the current to the latch must be maintained by lateral transistors Q3 or Q4 by way of the control circuit connected to write 1 (W1) line 21 and write 0 (W0) line 19, respectively. At time 2, W0 goes to 0, cutting off transistor Q4. Transistor Q3 injects current into the base of transistor Q2, turning off transistor Q1 (if that transistor were originally turned on). Transistor Q2 conducts and the latch is arbitrarily designated as being in the 1 state. Line W0 may then be brought back to the 1 state at time 3 and $\overline{WS}$ is brought back to the 1 state at time 4. When $\overline{WS}$ goes back to the "1" state, then transistor Q5 again conducts, injecting current into the latch circuit. While this explanation is aimed specifically at the embodiment of FIG. 1, it applies to the embodiment of FIG. 3 as well.

At this point, a 1 has been written into the memory cell latch. For an illustration of the reading of that information, refer again to FIG. 1. When $\overline{WS}$ is a 1, then transistor Q6 conducts, causing transistor Q7 to be nonconductive, thereby presenting a high impedance on read (RD) line 22. Assume that the cell has been selected for a RD cycle at time 5 by causing $\overline{WS}$ to go to a 0. When that happens, transistor Q6 is cut off and transistor Q7 is conditioned to become conductive, depending upon the state of the latch. Since transistor Q2 was turned on, transistor Q7 is held off by reason of its base being connected to the second collector 37 of transistor Q2. Sampling the RD line 22 will yield a high impedance or 1 as the contents of memory cell 10. During the read cycle, the latch is supplied with current from transistors Q3 and Q4. $\overline{WS}$ is brought back to the 1 state, turning on transistor Q5 which is then available for supplying current to the latch. The circuit of FIG. 3 operates in much the same manner, except that an additional transistor Q9 is utilized instead of a second collector on transistor Q2. When $\overline{WS}$ goes to 0 transistor Q5 is turned off and the latch is supplied by transistors Q3 and Q4'. With transistor Q2' conducting, transistor Q9 is turned off, turning on transistor Q7. This results in a ground voltage being presented on the RD' line which, in this embodiment, represents a 1. When $\overline{WS}$ is brought back to a 1, transistor Q5 is turned on and supplies current to the latch.

At time 9, $\overline{WS}$ is again brought to a 0 state indicating that the cell is selected. At time 10, W1 is brought to the 0 state while W0 is maintained at the 1 state. This causes transistor Q3 to be turned off and transistor Q4 to be turned on, thereby supplying current to the base of transistor Q1 causing transistor Q2 to be turned off, thereby setting the latch in the 0 state. At time 12, $\overline{WS}$ is brought back to the 1 state, turning transistor Q5 back on. This operation applies to the circuit of FIG. 1 and that of FIG. 3.

At time 13, $\overline{WS}$ is again brought to the 0 state to read the cell. Transistor Q6 is turned off, conditioning transistor Q7 to be turned on. Since transistor Q2 is turned off, transistor Q7 is turned on providing a 0 output on RD line 22 of FIG. 1. In the circuit of FIG. 3, transistor Q2' is turned off, transistor Q9 is turned on and transistor Q7 is turned off providing a high impedance or "0" output on line RD'. $\overline{WS}$ is again brought back to the 1 state until the cell is again selected.

The circuit of FIG. 2 differs from FIG. 1 implementation principally in the addition of transistor Q8, the use of line W0 as a read-out line, as well as a write 0 line and the addition of read/write line 51. Transistor Q5 is used to inject current into the latch circuit during the holding modes with transistors Q3 and Q4' being used to inject the current into the latch circuit during a write operation. During such a write operation, if W1' is 1, then W0' is a "0" as shown in FIG. 7, time 1–4. When the cell is selected at time 5 for a read operation, R/W line 51 is brought to the 1 state, turning on transistor Q8. Transistor Q8 is used to inject current into the latch during the read mode. During the read mode, $\overline{WS}$ is brought to the 0 state, turning off transistor Q6 which conditions transistor Q7 to be turned on, depending upon the state of the latch. If the latch is in the 1 state, then transistor Q2 is turned on, turning off transistor Q7 and providing a 1 output on WO'. On the other hand, if the latch is in the 0 state, then transistor Q1 is turned on and transitor Q2 is turned off, thereby turning on transistor Q7, bringing WO' to the 0 state.

In these embodiments, it is clear that in a matrix of such cells, impressing a 0 voltage on line $\overline{WS}$ partially selects the cells in the row connected to that $\overline{WS}$ line 29. The particular cell is selected by selecting line W1 or line W0 for the appropriate write cycle, since a selection will enable only one of the cells in a column.

With respect to the circuits of FIGS. 1 and 3, the particular row of cells for a read operation is selected by taking the appropriate $\overline{WS}$ line to the 0 state and then by simply sampling the RD line. Since all of the other cells in a particular column are not selected, the respective output transistors would be nonconductive. Therefore, the RD line is of a high impedance if the output of the selected cell is 1. If Q7 is conducting, the output is a 0. The circuit of FIG. 3 works in exactly the same way except that the output of transistor Q7 is inverted so that a 0 is indicated by a high impedance and a 1 is indicated by a low impedance.

Reference should now be made to FIG. 8 in the following brief description of the selection of a single cell. Assume that cell C4 is of the preferred embodiment of FIG. 1 and that it is desired to write a 0 in cell C4. The word select line $\overline{WS}$ (2) is brought to the 0 level, selecting cells C3 and C4. Then write 0 line W0 (2) is selected to set the latch circuit of cell C4 to the 0 state. Since line $\overline{WS}$ (2) has also been selected, C4 is receptive to a signal on line WO (2). Cell C2, however, has not had its corresponding word select line $\overline{WS}$ (1) activated and therefore its holding mode injection transistor Q5 continues to conduct and cell C2 is not receptive to an input on line W0 (2). In a similar manner, the latch circuit of cell C4 can be set to the 1 state by selecting line $\overline{WS}$ (2) and line W1 (2).

To read cell C4, line $\overline{WS}$ (2) is again selected and read line RD 2 is selected and sampled. Since cell C2 has not had its associated line $\overline{WS}$ (1) activated, its output transistor Q7 remains cut off, (as with any other selected cells in the row). If C4 is storing a 0, then its output transistor Q7 conducts and line RD (2) goes to the 0 state, indicating the contents of only C4. If cell C4 had contained a 1, then line RD (2) would have presented a high impedance, indicating a 1 in cell C4 because the output transistor of cell C2 (and that of any other cell in the row) would be cut off by reason of not having been selected.

The embodiments described herein are for illustrative purposes and are not intended to cover all possible variations which are within the purview of one skilled in the art. For example, the transistor types may well be reversed and other transistors, or electrodes added on existing transistors, may be employed. Further, the particular sequencing of signals as shown in FIG. 7 is subject to wide variance. For example, signals W1 and W0 need not be in the 1 state except during a memory access cycle when signal $\overline{WS}$ is in the 0 state. Also, the output indications in all cases may be logically reversed. These and other similar variances may be employed without departing from the scope of this invention.

What is claimed is:

1. A semiconductor memory cell formed on a common emitter region of one polarity semiconductor material having a memory access control circuit for providing a first voltage arbitrarily designated as a binary 1 and a second voltage arbitrarily designated as a binary 0 to provide a holding mode, a write mode, and a read mode, and having first and second vertical transistors of one polarity type, their emitters being integral with the common emitter region, electrically connected to form a latch circuit for setting the latch circuit in an arbitrarily designated 0 state by injecting current into the base of the first vertical transistor causing it to conduct and causing the second vertical transistor to be cut off and for setting the latch circuit in an arbitrarily designated 1 state by injecting current into the base of the second vertical transistor causing it to conduct and causing the first vertical transistor to be cut off, comprising:
   a. holding injection circuit means connected to the control circuit and the latch circuit for maintaining current injection into the base of the conducting first or second transistor during the holding mode;
   b. read-out means operatively connected to the control circuit and connected to the latch circuit for providing an indication of the binary state of the latch circuit; and
   c. write and read injection circuit means connected to the control circuit for selectively injecting current into the base of the conducting first or second vertical transistor to set the latch circuit in the 0 or 1 state respectively during the write mode, and for maintaining current injection into the base of the conducting first or second vertical transistor during the read mode.

2. The memory cell of claim 1 wherein the read-out means comprise a vertical output transistor of the one conductivity type its emitter being integral with the common emitter region, its base being connected to the collector of the second transistor and its collector providing the indication of the binary state of the latch circuit.

3. The memory cell of claim 2 wherein the write and read injection means further comprise:
   c.
      i. a first lateral transistor of the opposite conductivity type, having its emitter connected to the control circuit, its base integral with the common emitter region and its collector connected to the base of the second vertical transistor; and
      ii. a second lateral transistor of the opposite conductivity type, having its emitter connected to the control circuit, its base integral with the common emitter region, a first collector connected to the base of the first vertical transistor and the second collector connected to the base of the output transistor for providing base drive thereto.

4. The memory cell of claim 3 wherein the holding injection circuit means further comprise:
   a.
      i. a word select line formed in the common emitter region of the opposite polarity semiconductor material, connected to the control means; and
      ii. a third lateral transistor having its emitter integral with the work select line, its base integral with the common emitter region, one collector integral with the base of the first vertical transistor and another collector integral with the base of the second transistor.

5. The memory cell of claim 4 wherein the read-out means further comprise a vertical read-out transistor having its base integral with the word select line, its emitter integral with the common emitter region and its collector connected to the base of the output transistor.

6. The memory cell of claim 5 wherein the collector of the first lateral transistor is integral with the base of the second vertical transistor and the collector of the second lateral trnasistor is integral with the base of the first vertical transistor.

7. The memory cell of claim 2 wherein the write and read injection circuit means further comprise:

c.
  i. a first lateral transistor of the opposite conductivity type, having its emitter connected to the control circuit, its base integral with the common emitter region and its collector connected to the base of the second vertical transistor;
  ii. a second lateral transistor of the opposite conductivity type having its emitter connected to the control circuit, its base integral with the common emitter region and its collector connected to the base of the first vertical transistor; and
  iii. a third lateral transistor having its emitter connected to the control circuit, its base integral with the common emitter region, one collector integral with the base of the first vertical transistor, one collector integral with the base of the second vertical transistor and a third collector integral with the base of the output transistor to provide base drive thereto.

8. The memory cell of claim 7 wherein the holding injection circuit means further comprise:

a.
  i. a word select line formed in the common emitter region of the opposite polarity semiconductor material, connected to the control means; and
  ii. a fourth lateral transistor having its emitter integral with the word select line, its base integral with the common emitter region, one collector integral with the base of the first vertical transistor and another collector integral with the base of the second vertical transistor.

9. The memory cell of claim 8 wherein the read-out means further comprise a vertical read-out transistor having its base integral with the word select line, its emitter integral with the common emitter region and its collector connected to the base of the output transistor.

10. The memory cell of claim 9 wherein the collector of the first lateral transistor is integral with the base of the second vertical transistor and the collector of the second lateral trnasistor is integral with the base of the first vertival transistor.

11. The memory cell of claim 2 wherein the write and read injection circuit means further comprise:

c.
  (i) a first lateral transistor of the opposite conductivity type having its emitter connected to the control circuit, its base integral with the common emitter region and its collector connected to the base of the second vertical transistor.
  ii. a second lateral transistor of the opposite conductivity type having its emitter connected to the control circuit, its base integral with the common emitter region and its collector connected to the base of the first vertical transistor; and
  iii. a third lateral transistor having its emitter integral with the base of the first vertical transistor, its base integral with the common emitter region and its collector integral with the base of the output transistor to provide base drive thereto.

12. The memory cell of claim 11 wherein the holding injection circuit means further comprise:

a.
  i. a word select line formed in the common emitter region of the opposite polarity semiconductor material, connected to the control means; and
  ii. a fourth lateral transistor having its emitter integral with the word select line, its base integral with the common emitter region, one collector integral with the base of the vertical transistor and another collector integral with the base of the second vertical transistor.

13. The memory cell of claim 12 wherein the read-out means further comprise a vertical read-out transistor having its base integral with the word select line, its emitter integral with the common emitter region and its collector connected to the base of the output transistor.

14. The memory cell of claim 13 wherein the collector of the first lateral transistor is integral with the base of the second vertical transistor and the collector of the second lateral transistor is integral with the base of the first vertical transistor.

15. In a memory system having an array of semiconductor memory cells arranged in columns and rows on a common emitter region of one polarity semiconductor material, a plurality of word lines of the other polarity semiconductor material formed in the common emitter region and each word line being attached to each cell in a respective row, a plurality of conductive, column select lines, at least three column select lines being attached to each cell in a column, and a memory access control circuit for selecting a word select line and three column select lines to select a particular cell and to provide thereto a first voltage arbitrarily designated as a binary 1 and a second voltage arbitrarily designated as a binary 0 to provide a holding mode, a write mode, and a read mode, each cell having first and second vertical transistors of one polarity type, their emitters being integral with the common emitter region, electrically connected to form a latch circuit for setting the latch circuit in an arbitrarily designated 0 state by injecting current into the base of the first vertical transistor causing it to conduct and causing the second vertical transistor to be cut off and for setting a latch circuit in an arbitrarily designated 1 state by injecting current into the base of the second vertical transistor causing it to conduct and causing the first vertical transistor to be cut off, each cell comprising:

a. a holding injection lateral transistor of the opposite conductivity type having its emitter integral with the corresponding word select line, its base integral with the common emitter region, a first collector integral with the base of the second vertical transistor and a second collector integral with the base of the first vertical transistor.

b. read-out means connected to the first of the three corresponding column select lines and connected to the latch circuit for providing an indication of the binary state of the latch circuit; and c. write and read injection circuit means connected to the second and third column select lines for selectively injecting current into the base of the conducting first or second vertical transistor to set the latch circuit in the 0 or 1 state, respectively, during the write mode, and for maintaining current injection into the base of the conducting first or second vertical transistor during the read mode.

16. The memory system of claim 15 wherein the read-out means of each cell further comprise:
   b.
   i. a vertical output transistor of the one conductivity type, its emitter being integral with the common emitter region, its base being connected to the collector of the second vertical transistor and its collector providing the indication of the binary state of the latch circuit; and
   ii. a vertical read-out transistor of the one conductivity type, having its base integral with the corresponding word select line, its emitter integral with the common emitter region and its collector connected to the base of the output transistor.

17. The memory system of claim 16 wherein the write and read injection means further comprise:
   c.
   i. a first lateral transistor of the opposite conductivity type having its emitter connected to the second column select line, its base integral with the common emitter region and its collector integral with the base of the second vertical transistor; and
   ii. a second lateral transistor of the opposite conductivity type having its emitter connected to the third column select line, its base being integral with the common emitter region, a first collector integral with the base of the first vertical transistor and a second collector being integral with the base of the output transistor for providing base drive thereto.

18. The memory system of claim 16 wherein the write and read injection means further comprise:
   c.
   i. a first lateral transistor of the opposite conductivity type having its emitter connected to the second select line, its base integral with the common emitter region and its collector connected to the base of the second vertical transistor;
   ii. a second lateral transistor of the opposite conductivity type having its emitter connected to the first column select line, its base integral with the common emitter region and its collector connected to the base of the first vertical transistor; and
   iii. a third lateral transistor having its emitter connected to the third column select line, its base integral with the common emitter region, one collector integral with the base of the first vertical transistor, one collector integral with the base of the second vertical transistor and the third collector integral with the base of the output transistor to provide base drive thereto.

19. The memory system of claim 16 wherein the write and read injection circuit means of each cell further comprise:
   c.
   i. a first lateral transistor of the opposite conductivity type having its emitter connected to the second column select line, its base integral with the common emitter region and its collector connected to the base of the second vertical transistor;
   ii. a second lateral transistor of the opposite conductivity type having its emitter connected to the third column select line, its base integral with the common emitter region and its collector connected to the base of the first vertical transistor; and
   iii. a third lateral transistor having its emitter integral with the base of the first vertical transistor, its base integral with the common emitter region and its collector integral with the base of the output transistor to provide base drive thereto.

* * * * *